(12) United States Patent
Hsu

(10) Patent No.: US 8,017,442 B2
(45) Date of Patent: Sep. 13, 2011

(54) METHOD OF FABRICATING A PACKAGE STRUCTURE

(75) Inventor: Shih-Ping Hsu, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 0 days.

(21) Appl. No.: 12/909,222

(22) Filed: Oct. 21, 2010

(65) Prior Publication Data

US 2011/0097851 A1 Apr. 28, 2011

(30) Foreign Application Priority Data

Oct. 22, 2009 (TW) .............................. 98135717 A

(51) Int. Cl.
*H01L 21/00* (2006.01)
(52) U.S. Cl. ................. 438/113; 257/E21.214; 438/110
(58) Field of Classification Search .................. 438/110, 438/113, 127, 109; 257/E21.214
See application file for complete search history.

(56) References Cited

U.S. PATENT DOCUMENTS

| | | | |
|---|---|---|---|
| 2007/0124925 A1* | 6/2007 | Nakamura | 29/830 |
| 2009/0269890 A1* | 10/2009 | Shimanuki | 438/124 |
| 2009/0323299 A1* | 12/2009 | Miyamoto et al. | 361/760 |
| 2010/0132993 A1* | 6/2010 | Nakamura et al. | 174/260 |

\* cited by examiner

*Primary Examiner* — Matthew Smith
*Assistant Examiner* — Christine Enad
(74) *Attorney, Agent, or Firm* — Peter F. Corless; Steven M. Jensen; Edwards Angell Palmer & Dodge LLP

(57) ABSTRACT

A method fabricates a packaging structure, including cutting a complete panel of packaging substrates with a large area into a plurality of packaging substrate blocks each having a plurality of packaging substrate units; mounting a semiconductor chip on each of the packaging substrate units and securing the semiconductor chip to the packaging substrate unit with a molding material, to form a plurality of packaging structure blocks each having a plurality of packaging structure units; and cutting the packaging structure block into a plurality of packaging structure units. Accordingly, each of the packaging structure unit has a moderate area, the alignment difference between the packaging structure units in each of the packaging structure blocks can be reduced, and the semiconductor chips for all the packaging substrate units in each of the packaging substrate blocks can be packaged at one time. Therefore, the yield is increased and the overall cost is reduced.

16 Claims, 7 Drawing Sheets

METHOD OF FABRICATING A PACKAGE STRUCTURE

CROSS-REFERENCES TO RELATED APPLICATIONS

This application claims under 35 U.S.C. §119(a) the benefit of Taiwanese Application No. 098135717, filed Oct. 22, 2009, the entire contents of which is incorporated herein by reference.

BACKGROUND OF THE INVENTION

1. Field of the Invention

This invention relates to methods of fabricating a packaging structure, and more particularly, to a method of fabricating a packaging structure that may increase the yield and reduce the whole cost.

2. Description of Related Art

According to the modern wire-bonding semiconductor packaging technology, an inactive surface of a semiconductor chip is mounted on a packaging substrate, a plurality of electrode pads are installed on an active surface of the semiconductor chip. A plurality of wire-bonding pads are installed on a surface of the packaging substrate on which the semiconductor chip is mounted, and are electrically connected via bonding wires to the electrode pads, allowing the semiconductor chip to be electrically connected to the packaging substrate.

A packaging substrate of the prior art comprises a core board and two built-up structures that are symmetrically installed on two opposite surfaces of the core board. The use of the core board results in the increasing of wire length and structure thickness, which is contradictory to the compact demand of modern electronic products. Accordingly, a packaging substrate having a coreless structure comes to the market, which has a shorter wire length and thinner structure and meets the compact demand.

A method of fabricating a wire-bonding packaging substrate according to the prior art includes: providing a complete panel of substrate body that has a front-end fabricating process completed, an outermost circuit of the complete panel of substrate body having a plurality of wire-bonding pads and an insulating protection layer; forming a plurality of openings in the insulating protection layer, allowing the wire-bonding pads of the built-up structure to be exposed from the openings; forming a surface treatment layer on the exposed wire-bonding pads, so as to form a complete panel of packaging substrates; cutting the complete panel of packaging substrates into a plurality of packaging substrate units or a plurality of packaging substrate strips, each of the packaging substrate strips having a plurality of packaging substrate units; and, transferring the packaging substrate strips to a packaging factory for subsequent chip attachment, packaging and/or singulation processes.

However, if the chip attachment and packaging processes are performed after the complete panel of packaging substrates is cut into the packaging substrate units, only one of the packaging substrate units is processed at one time, which reduces the yield and increases the cost. Moreover, if the chip attachment, packaging and singulation processes are performed after the complete panel of packaging substrates is cut into the packaging substrate strips, each of the packaging substrate strips has to have a frame reserved for the packaging substrate strip to assist during the manufacturing processes. The frame occupies too much the area and wastes the material cost.

With the packaging substrate becoming thinner and thinner, it is more and more difficult to perform the chip attachment or packaging process on the packaging substrate units or packaging substrate strips.

If the chip attachment, packaging and singulation processed are performed on the complete panel of substrate, without cutting the complete panel of packaging substrates into a plurality of packaging substrate units or a plurality of packaging substrate strips in advance, a larger semiconductor equipment is required. Accordingly, the equipment cost is increased. Besides, the larger the area of the complete panel of packaging substrates is, the lower the precision becomes. Therefore, the final packaging structure units have a larger fabricating error, which affects the yield.

Therefore, how to solve the problems of the method of fabricating a packaging structure of the prior art that the fabricating steps are complicated, yield is low, too many effective area of the substrate is wasted and the cost is high is becoming one of the most popular issues in the art.

SUMMARY OF THE INVENTION

In view of the above-mentioned problems of the prior art, the present invention provides a method of fabricating a packaging structure, comprising: providing a complete panel of up-down paired packaging substrates, wherein a plurality of wire-bonding pads and an insulating protection layer are formed on each of two opposite outermost layers of the packaging substrate, and a plurality of openings are formed on each of the insulating protection layers, allowing the wire-bonding pads to be exposed from the openings; separating the complete panel of up-down paired packaging substrates and cutting the complete panel of packaging substrates, to form a plurality of packaging substrate blocks each including a first surface having the wire-bonding pads and the insulating protection layer and an opposite second surface having a dielectric layer and a plurality of conductive pads embedded in and exposed from the dielectric layer, each of the packaging substrate blocks having M×N packaging substrate units arranged in an array, wherein M and N are integers greater than one; installing a second carrier board on the conductive pads and the dielectric layer; mounting a semiconductor chip on the insulating protection layer of each of the packaging substrate units, to form a packaging structure block having a plurality of packaging structure units, the semiconductor chip having an active surface and an opposite inactive surface, wherein the active surface has a plurality of electrode pads thereon, the inactive surface is stuck on the insulating protection layer, and each of the electrode pads is electrically connected via a bonding wire to each of the wire-bonding pads correspondingly; forming a molding material on the insulating protection layer, the bonding wires and the semiconductor chips; removing the second carrier board; and cutting the packaging structure blocks into the packaging structure units.

According to the aforesaid method, the complete panel of up-down paired packaging substrates is fabricated by the following steps of: providing a first carrier board having two opposite surfaces; forming a separable layer on each of the surfaces of the first carrier board, the separable layer being less than the first carrier board in area; forming an adhesive layer on a portion of each of the surfaces of the first carrier board where no separable layer is formed, allowing the adhesive layer to surround the separable layer; forming a metal layer on the separable layer and the adhesive layer; forming on the metal layer a plurality of conductive pads and a built-up structure sequentially, the built-up structure comprising at least a dielectric layer, a wiring layer formed on the dielectric layer, and a plurality of conductive vias formed in the dielectric layer and electrically connecting the wiring layer and the conductive pads, the wiring layer of an outermost layer of the built-up structure having the wire-bonding pads; and forming on the outermost layer of the built-up structure the insulating protection layer in which the openings are formed, allowing the wire-bonding pads to be exposed from the openings correspondingly.

In the aforesaid method, the packaging substrate blocks are fabricated by the following steps of: cutting the complete panel of up-down paired packaging substrates along an edge thereof, with a cutting edge passing the separable layer; removing the first carrier board and the separable layer, so as to separate the complete panel of up-down paired packaging substrates into two independent complete panels of packaging substrates; and cutting the complete panel of packaging substrates and removing the metal layer, so as to form the packaging substrate blocks.

The aforesaid method further comprises forming a surface treatment layer on the wire-bonding pads, wherein the surface treatment layer comprises Ni/Au, electroless nickel/electroless palladium/immersion gold (ENEPIG), Sn, Ag, or Au.

The aforesaid method further comprises, after the second carrier board is removed, forming solder balls on the conductive pads.

The present invention further provides another method of fabricating a packaging structure, comprising: providing a complete panel of up-down paired packaging substrates, wherein a plurality of conductive pads and an insulating protection layer are formed on each of two outermost opposite surfaces of the packaging substrate, and a plurality of openings are formed on in each of the insulating protection layers, allowing the conductive pads to be exposed from the openings; separating the complete panel of up-down paired packaging substrates and cutting the complete panel of packaging substrates, to form a plurality of packaging substrate blocks each including a first surface having the wire-bonding pads and the insulating protection layer and an opposite second surface having a dielectric layer and a plurality of wire-bonding pads embedded in and exposed from the dielectric layer, each of the packaging substrate blocks having M×N packaging substrate units arranged in an array, wherein M and N are integers greater than one; installing a second carrier board on the insulating protection layer of the packaging substrate block; mounting a semiconductor chip on the dielectric layer of each of the packaging substrate units, to form a packaging structure block having a plurality of packaging structure units, the semiconductor chip having an active surface and an opposite inactive surface, wherein the active surface has a plurality of electrode pads thereon, the inactive surface is stuck on the dielectric layer, and each of the electrode pads is electrically connected via a bonding wire to each of the wire-bonding pads correspondingly; forming a molding material on the dielectric layer, the bonding wires and the semiconductor chips; removing the second carrier board; and cutting the packaging structure blocks into the packaging structure units.

In the aforesaid method, the complete panel of up-down paired packaging substrates is fabricated by the following steps of: providing a first carrier board having two opposite surfaces; forming a separable layer on each of the surfaces of the first carrier board, the separable layer being less than the first carrier board in area; forming an adhesive layer on a portion of each of the surfaces of the first carrier board where no separable layer is formed, allowing the adhesive layer to surround the separable layer; forming a metal layer on the separable layer and the adhesive layer; forming on the metal layer a plurality of wire-bonding pads and a built-up structure sequentially, the built-up structure comprising at least a dielectric layer, a wiring layer formed on the dielectric layer, and a plurality of conductive vias formed in the dielectric layer and electrically connecting the wiring layer and the wire-bonding pads, the wiring layer of an outermost layer of the built-up structure having the conductive pads; and forming on the outermost layer of the built-up structure the insulating protection layer in which the openings are formed, allowing the conductive pads to be exposed from the openings correspondingly.

In the aforesaid method, the packaging substrate blocks are fabricated by the following steps of: cutting the complete panel of up-down paired packaging substrates along an edge thereof, with a cutting edge passing the separable layer; removing the first carrier board and the separable layer, so as to separate the complete panel of up-down paired packaging substrates into two independent complete panels of packaging substrates; and cutting the complete panel of packaging substrates and removing the metal layer, so as to form the packaging substrate blocks.

The aforesaid method further comprises forming a surface treatment layer on the wire-bonding pads, wherein the surface treatment layer comprises Ni/Au, electroless nickel/electroless palladium/immersion gold (ENEPIG), Sn, Ag, or Au.

The aforesaid method further comprises, after the second carrier board is removed, forming solder balls on the conductive pads.

In conclusion, the method of fabricating a packaging structure first cuts a complete panel of packaging substrates into a plurality of packaging substrate blocks each comprising a plurality of packaging substrate units, then installs a semiconductor chip on each of the packaging substrate units, and last cuts the packaging structure block into a plurality of packaging structure units. Compared with the prior art, the method of fabricating a packaging structure of the present invention integrates a packaging substrate fabricating process with a semiconductor chip packaging process, and packages all of the semiconductor chips correspondingly on all of the packaging substrate units in each of the packaging substrate blocks at one time. Accordingly, the fabricating process is simplified and the yield is increased. Moreover, the packaging substrate blocks of the present invention have a moderate area, the alignment difference between the packaging structure units in each of the packaging structure blocks can be reduced, and the semiconductor chips for all the packaging substrate units in each of the packaging substrate blocks can be packaged at one time. Therefore, the yield is increased and the overall cost is reduced.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

First Embodiment

Figure 1A:
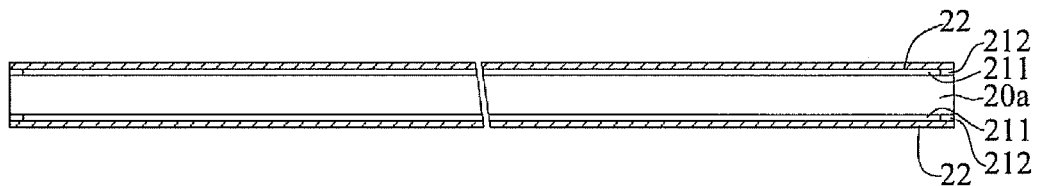
FIGS. 1A-1H are cross-sectional schematic diagrams of a method of fabricating a packaging structure of a first embodiment according to the present invention, wherein FIG. 1A' is another embodiment of FIG. 1A, and FIG. 1E' is a top view of FIG. 1E.
Figure 1A:
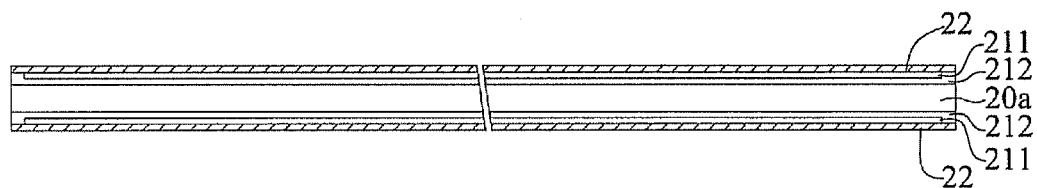
Figure 1B:
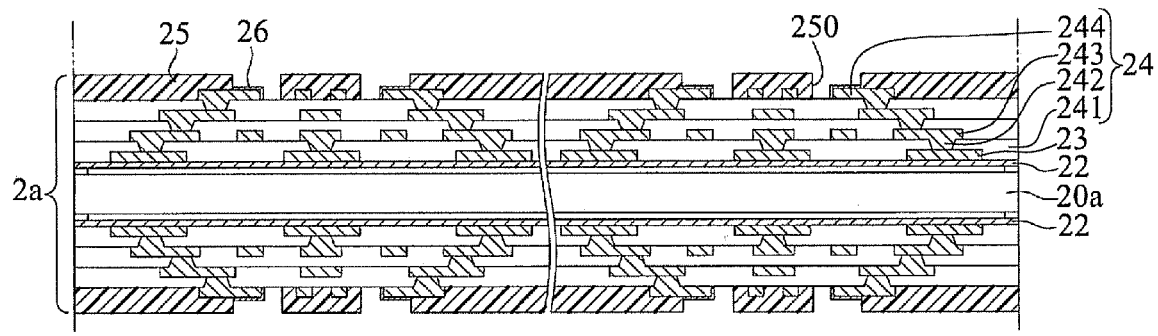
Figure 1C:
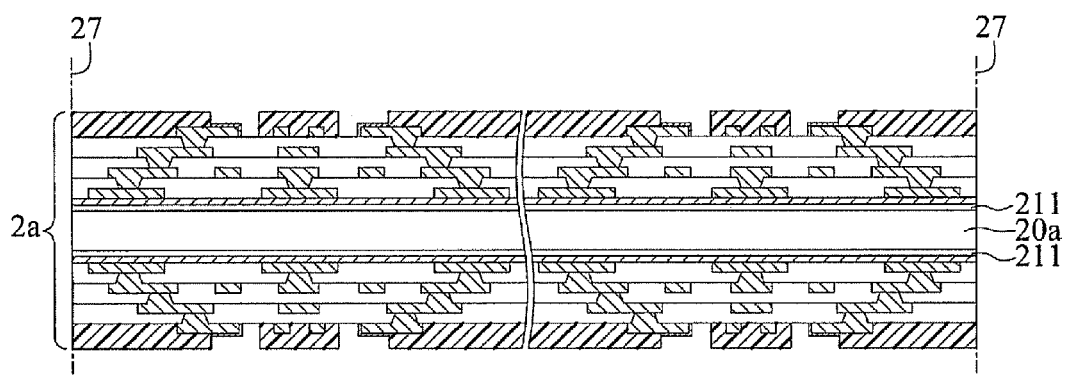
Figure 1D:
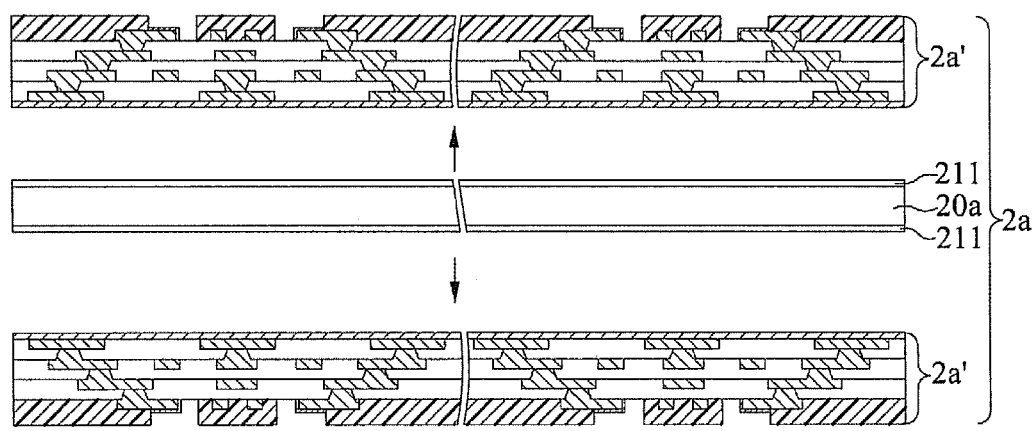
Figure 1E:
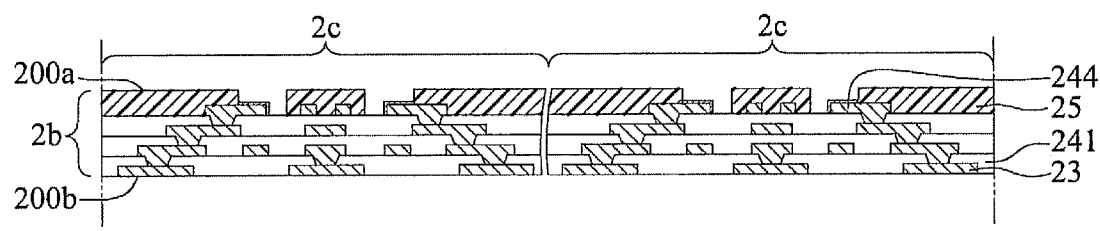
Figure 1E:
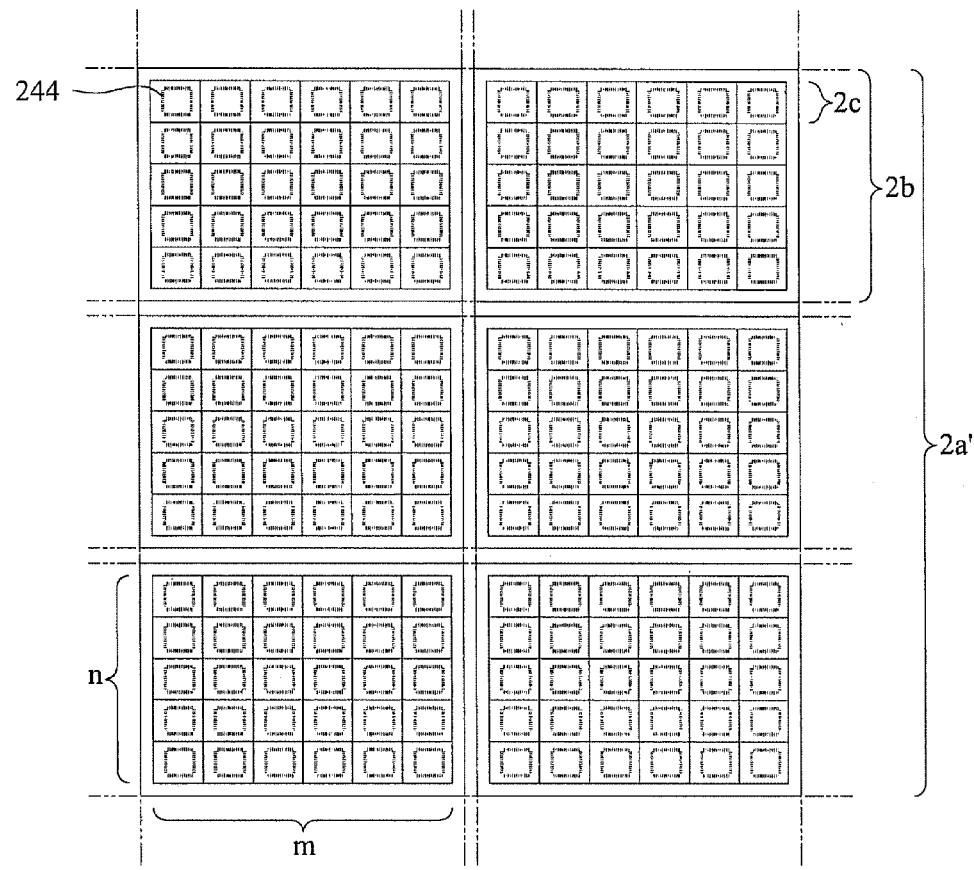

Please refer to FIGS. 1A-1H, which are cross-sectional schematic diagrams of a method of fabricating a packaging structure of a first embodiment according to the present invention, wherein FIG. 1A' is another embodiment of FIG. 1A, and FIG. 1E' is a top view of FIG. 1E.

As shown in FIG. 1A, a first carrier board 20a having two opposite surfaces is provided. A separable layer 211 less than the first carrier board 20a in area is formed on each of the surfaces of the first carrier board 20a. An adhesive layer 212 is formed on a portion of each of the surfaces of the first carrier board 20a where no separable layer 211 is formed, allowing the adhesive layer 212 to surround the separable layer 212. A metal layer 22 is formed on the separable layer 211 and the adhesive layer 212. In an embodiment of the present invention, the separable layer 211 may be a separable film, and the metal layer 22 may comprise copper, and may be a seed layer that is used as a current conduction route during an electroplating process.

FIG. 1A' shows another embodiment of FIG. 1A. Similarly, the first carrier board 20a having the opposite surfaces is provided. The adhesive layer 212 is formed on each of the surfaces, and the separable layer 211 is installed on (e.g., adhered to) the adhesive layer 212, the separable layer 211 having an area less than the area of the first carrier board 20a and surrounded by the adhesive layer 212. The metal layer 22 is formed on the separable layer 211 and the adhesive layer 212. The following method is illustrated according to FIG. 1A.

As shown in FIG. 1B, a plurality of conductive pads 23 and a built-up structure 24 are formed on the metal layer 22 sequentially. The built-up structure 24 comprises at least a dielectric layer 241, a wiring layer 243 formed on the dielectric layer 241, and a plurality of conductive vias 242 formed in the dielectric layer 241 and electrically connecting the wiring layer 243 and the conductive pads 23. The wiring layer 243 of an outermost layer of the built-up structure 24 has a plurality of wire-bonding pads 244. An insulating protection layer 25 is formed on the outermost layer of the built-up structure 24, and a plurality of openings 250 are formed in the insulating protection layer 25, allowing the wire-bonding pads 244 to be exposed from the openings 250 correspondingly. A surface treatment layer 26 is formed on the wire-bonding pads 244. Accordingly, a complete panel of up-down paired packaging substrates 2a is formed. In an embodiment of the present invention, the surface treatment layer 26 comprises Ni/Au, electroless nickel/electroless palladium/immersion gold (ENEPIG), Sn, Ag, or Au.

As shown in FIG. 1C, the complete panel of up-down paired packaging substrates 2a is cut alone an edge thereof, with a cutting edge 27 passing the separable layer 211.

As shown in FIG. 1D, the first carrier board 20a and the separable layer 211 are removed, so as to separate the complete panel of up-down paired packaging substrates 2a into two independent complete panels of packaging substrates 2a'. If the structure shown in FIG. 1A' is considered, the first carrier board 20a, the separable layer 211 and the adhesive layer 212 are removed, so as to form two independent complete panels of packaging substrates 2a'.

As shown in FIGS. 1E and 1E', in which FIG. 1E' is a top view of FIG. 1E, the complete panel of packaging substrates 2a' is cut, and the metal layer 22 is removed, so as to form a plurality of packaging substrate blocks 2b each comprising a first surface 200a having the wire-bonding pads 244 and the insulating protection layer 25 and an opposite second surface 200b having the dielectric layer 241 and the conductive pads 23 that are embedded in and exposing the dielectric layer 241. Each of the packaging substrate blocks 2b has M×N packaging substrate units 2c arranged in an array, wherein M and N are integers greater than one. In the first embodiment, M is equal to six, and N is equal to five.

Figure 1F:
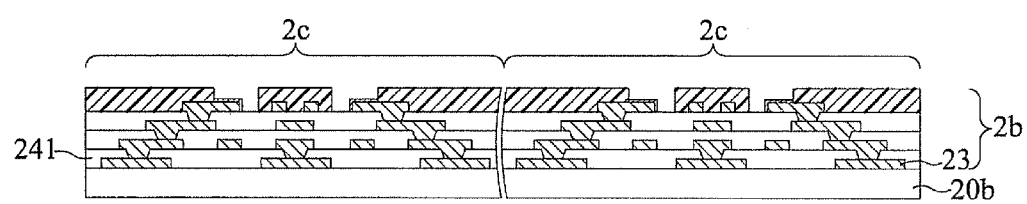

As shown in FIG. 1F, a second carrier board 20b is installed on the conductive pads 23 and the dielectric layer 241.

Figure 1G:
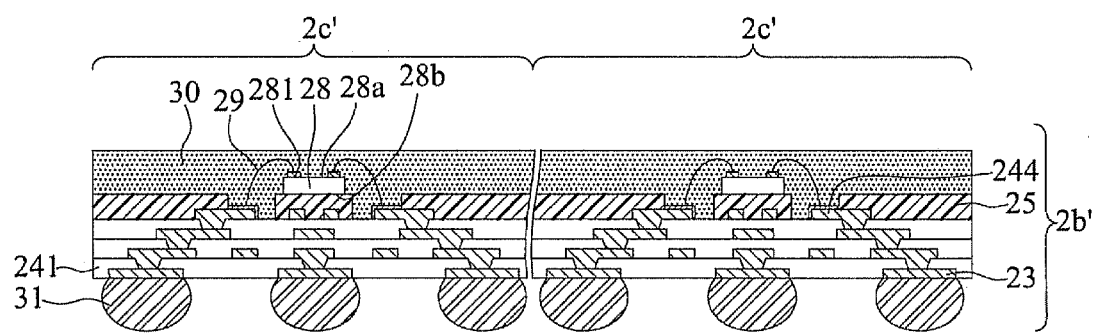

As shown in FIG. 1G, a semiconductor chip 28 is installed on the insulating protection layer 25 of each of the packaging substrate units 2c, to form a packaging structure block 2b' having a plurality of packaging structure units 2c'. The semiconductor chip 28 has an active surface 28a and an opposite inactive surface 28b. The active surface 28a has a plurality of electrode pads 281 thereon. The inactive surface 28b is stuck on the insulating protection layer 25. The electrode pads 281 are electrically connected via bonding wires 29 to the wire-bonding pads 244. A molding material 30 is formed on the insulating protection layer 25, the bonding wires 29 and the semiconductor chip 28. The second carrier board 20b is then removed, and solder balls are formed on the conductive pads 23. Alternatively, no solder balls 31 are formed on the conductive pads 23, and the conductive pads 23 are provided as electrical connection (not shown) for a land grid array (LGA) structure.

Figure 1H:
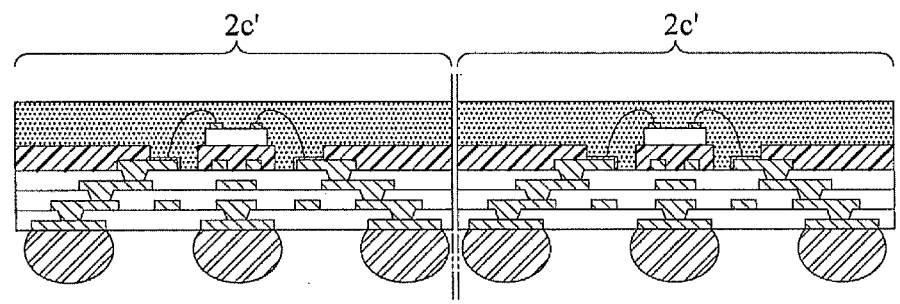

As shown in FIG. 1H, the packaging structure block 2b' is cut into a plurality of packaging structure units 2c'.

Second Embodiment

Please refer to FIGS. 2A-2H, which are cross-sectional schematic diagrams of a method of fabricating a packaging structure of a second embodiment according to the present invention.

Figure 2A:
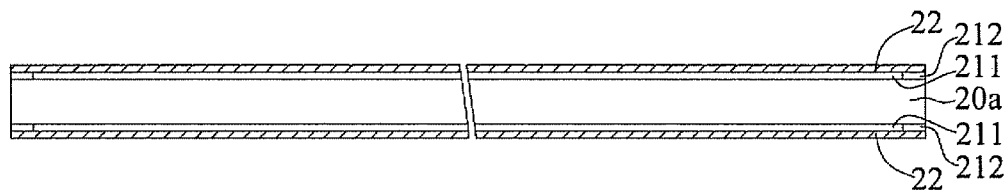
FIGS. 2A-2H are cross-sectional schematic diagrams of a method of fabricating a packaging structure of a second embodiment according to the present invention.

As shown in FIG. 2A, a first carrier board 20a having two opposite surfaces is provided. A separable layer 211 is formed on each of the surfaces of the first carrier board 20a. The separable layer 211 is less than the first carrier board 20a in area. An adhesive layer 212 is formed on a portion of each of the surfaces of the first carrier board 20a where no separable layer 211 is formed, allowing the adhesive layer 212 to surround the separable layer 211. A metal layer 22 is formed on the separable layer 211 and the adhesive layer 212. In an embodiment of the present invention, the separable layer 211 may be a release film, and the metal layer 22 may comprise copper and may be a seed layer that is used as a current conduction route during an electroplating process. Similarly, another embodiment of FIG. 2A is also shown in FIG. 1A', further description hereby omitted.

Figure 2B:
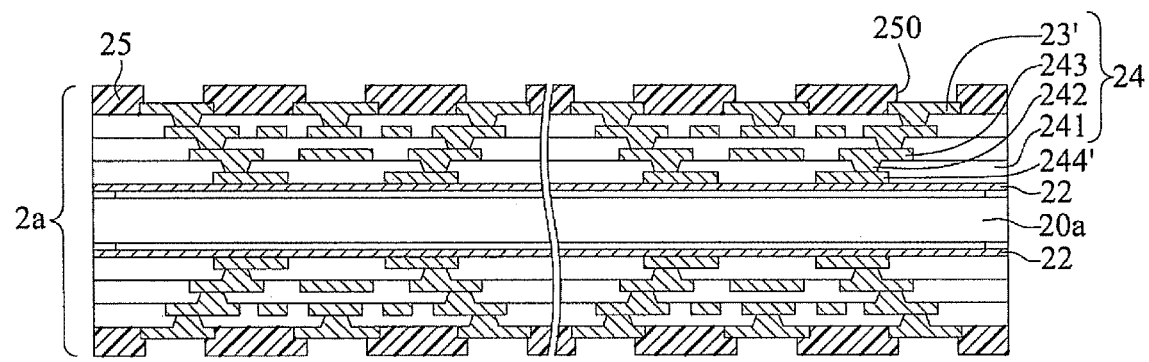

As shown in FIG. 2B, a plurality of wire-bonding pads 244' and a built-up structure 24 are formed on the metal layer 22 sequentially. The built-up structure 24 comprises at least a dielectric layer 241, a wiring layer 243 formed on the dielectric layer 241, and a plurality of conductive vias 242 formed in the dielectric layer 241 and electrically connecting the wiring layer 243 and the wire-bonding pads 244'. A plurality of conductive pads 23' are formed on the wiring layer 243 of an outermost layer of the built-up structure 24. An insulating protection layer 25 is formed on the outermost layer of the built-up structure 24, and a plurality of openings 250 are formed in the insulating protection layer 25, allowing the conductive pads 23' to be exposed from the openings 250 correspondingly, and form a complete panel of up-down paired packaging substrates 2a.

Figure 2C:
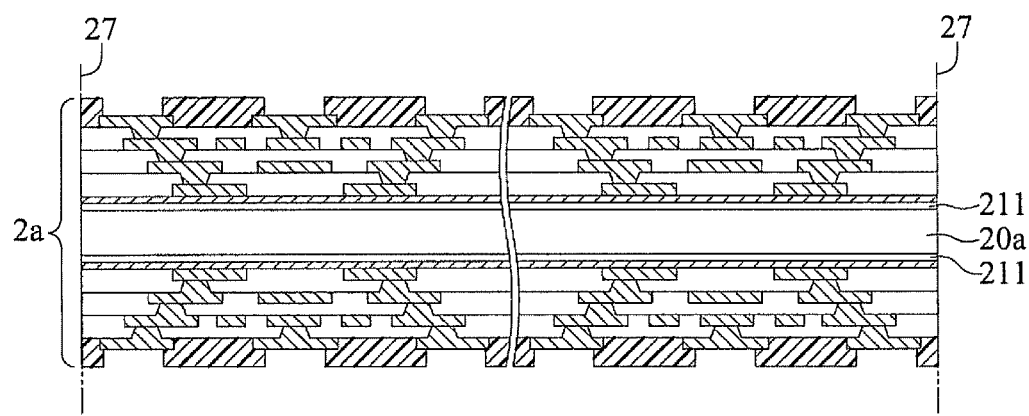

As shown in FIG. 2C, the complete panel of up-down paired packaging substrates 2a is cut along an edge thereof, with a cutting edge 27 passing the separable layer 211, so as to remove the adhesive layer 212.

Figure 2D:
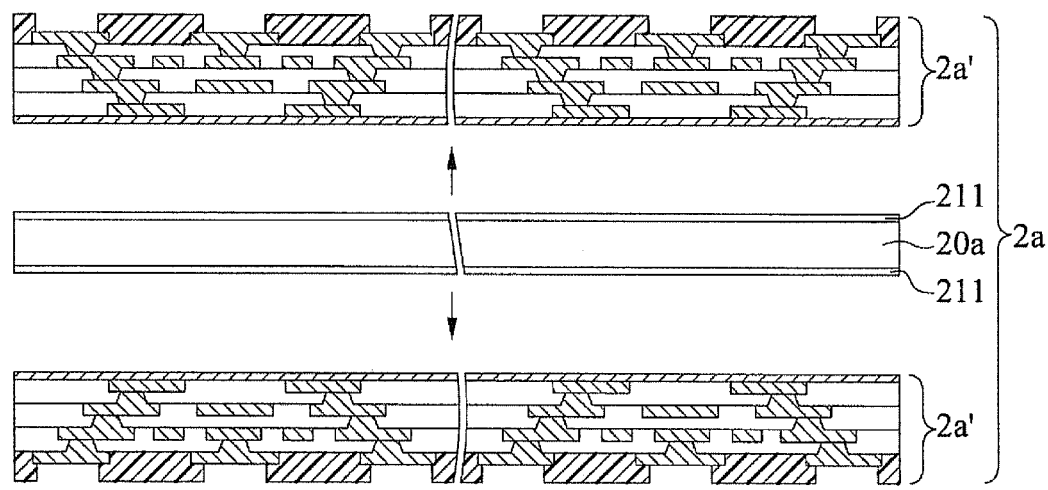

As shown in FIG. 2D, the first carrier board 20a and the separable layer 211 are removed, so as to separate the complete panel of up-down paired packaging substrates 2a into two independent complete panels of packaging substrates 2a'.

Figure 2E:
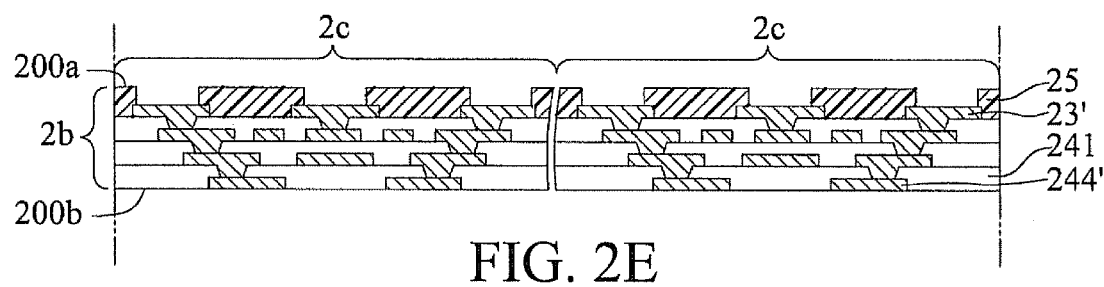

As shown in FIG. 2E, the complete panel of packaging substrates 2a' is cut, and the metal layer 22 is removed, so as to form a plurality of packaging substrate blocks 2b each including a first surface 200a having the conductive pads 23' and the insulating protection layer 25 and an opposite second surface 200b having the dielectric layer 241 and the wire-bonding pads 244' embedded in and exposing the dielectric layer 241. Each of the packaging substrate blocks 2b has M×N packaging substrate units 2c arranged in an array, where M and N are integers greater than one.

Figure 2F:
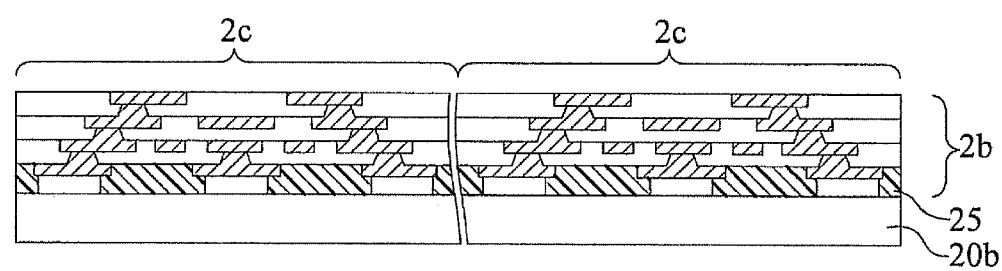

As shown in FIG. 2F, a second carrier board 20b is installed on the insulating protection layer 25 of the packaging substrate block 2b.

Figure 2G:
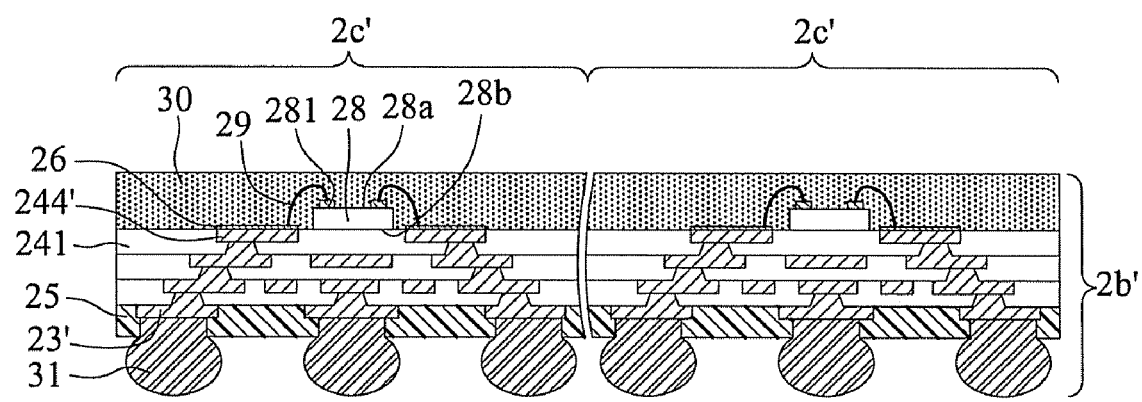

As shown in FIG. 2G, a surface treatment layer 26 is formed on the wire-bonding pads 244'. In an embodiment of the present invention, the surface treatment layer 26 comprises Ni/Au, electroless nickel/electroless palladium/immersion gold (ENEPIG), Sn, Ag, or Au. A semiconductor chip 28 is installed on the dielectric layer 241 of each of the packaging substrate units 2c, so as to form a packaging structure block 2b' having a plurality of packaging structure units 2c'. The semiconductor chip 28 has an active surface 28a and an opposite inactive surface 28b. The active surface 28a has a plurality of electrode pads 281 thereon. The inactive surface 28b is stuck on the dielectric layer 241. The electrode pads 281 are electrically connected via bonding wires 29 to the wire-bonding pads 244'. A molding material 30 is formed on the dielectric layer 241, the bonding wires 29 and the semiconductor chip 28. Then, the second carrier board 20b is removed, and solder balls 31 are formed on the conductive pads 23'. Alternatively, no solder balls 31 are formed on the conductive pads 23', and the conductive pads 23' are provided as electrical connection (not shown) for a land grid array (LGA) structure.

Figure 2H:
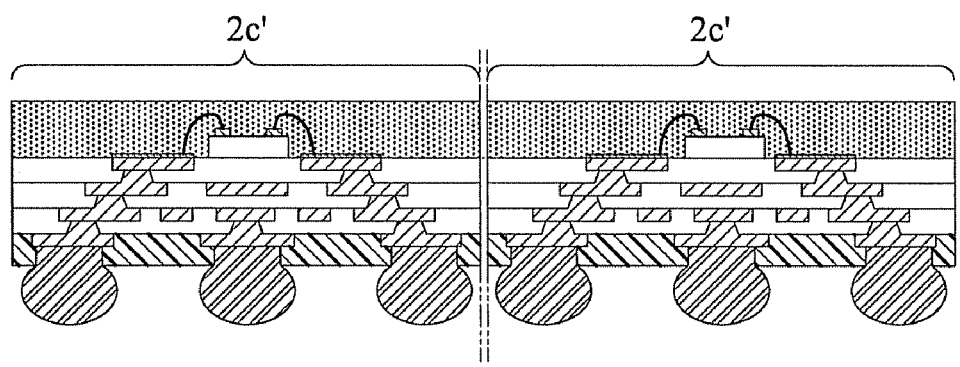

As shown in FIG. 2H, the packaging structure block 2b' is cut into a plurality of packaging structure units 2c'.

In another embodiment of the present invention, a complete panel of up-down paired packaging substrates can be cut into a plurality of up-down paired packaging substrates blocks ahead, and then each of the up-down paired packaging substrates blocks is separated into two independent packaging substrate blocks. The remaining steps are the same as the above, further description hereby omitted.

In conclusion, the method of fabricating a packaging structure first cuts a complete panel of packaging substrates into a plurality of packaging substrate blocks each comprising a plurality of packaging substrate units, then installs a semiconductor chip on each of the packaging substrate units, and last cuts the packaging structure block into a plurality of packaging structure units. Compared with the prior art, the method of fabricating a packaging structure of the present invention integrates a packaging substrate fabricating process with a semiconductor chip packaging process, and packages all of the semiconductor chips correspondingly on all of the packaging substrate units in each of the packaging substrate blocks at one time. Accordingly, the fabricating process is simplified and the yield is increased. Moreover, the packaging substrate blocks of the present invention have a moderate area, the alignment difference between the packaging structure units in each of the packaging structure blocks can be reduced, and the semiconductor chips for all the packaging substrate units in each of the packaging substrate blocks can be packaged at one time. Therefore, the yield is increased and the overall cost is reduced.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A method of fabricating a packaging structure, comprising:

providing a complete panel of up-down paired packaging substrates, wherein a plurality of wire-bonding pads and an insulating protection layer are formed on each of two opposite outermost layers of the packaging substrate, and a plurality of openings are formed on each of the insulating protection layers, allowing the wire-bonding pads to be exposed from the openings;

separating the complete panel of up-down paired packaging substrates and cutting the complete panel of packaging substrates, to form a plurality of packaging substrate blocks each including a first surface having the wire-bonding pads and the insulating protection layer and an opposite second surface having a dielectric layer and a plurality of conductive pads embedded in and exposed from the dielectric layer, each of the packaging substrate blocks having M×N packaging substrate units arranged in an array, wherein M and N are integers greater than one;

installing a second carrier board on the conductive pads and the dielectric layer;

mounting a semiconductor chip on the insulating protection layer of each of the packaging substrate units, to form a packaging structure block having a plurality of packaging structure units, the semiconductor chip having an active surface and an opposite inactive surface, wherein the active surface has a plurality of electrode pads thereon, the inactive surface is stuck on the insulating protection layer, and each of the electrode pads is electrically connected via a bonding wire to each of the wire-bonding pads correspondingly;

forming a molding material on the insulating protection layer, the bonding wires and the semiconductor chips;

removing the second carrier board; and cutting the packaging structure blocks into the packaging structure units.

2. The method of claim 1, wherein the complete panel of up-down paired packaging substrates is fabricated by the following steps of:

providing a first carrier board having two opposite surfaces;

forming a separable layer on each of the surfaces of the first carrier board, the separable layer being less than the first carrier board in area;

forming an adhesive layer on a portion of each of the surfaces of the first carrier board where no separable layer is formed, allowing the adhesive layer to surround the separable layer;

forming a metal layer on the separable layer and the adhesive layer;

forming on the metal layer a plurality of conductive pads and a built-up structure sequentially, the built-up structure comprising at least a dielectric layer, a wiring layer formed on the dielectric layer, and a plurality of conductive vias formed in the dielectric layer and electrically connecting the wiring layer and the conductive pads, the wiring layer of an outermost layer of the built-up structure having the wire-bonding pads; and forming on the outermost layer of the built-up structure the insulating protection layer in which the openings are formed, allowing the wire-bonding pads to be exposed from the openings correspondingly.

3. The method of claim 2, wherein the packaging substrate blocks are fabricated by the following steps of:

cutting the complete panel of up-down paired packaging substrates along an edge thereof, with a cutting edge passing the separable layer;

removing the first carrier board and the separable layer, so as to separate the complete panel of up-down paired packaging substrates into two independent complete panels of packaging substrates; and cutting the complete panel of packaging substrates and removing the metal layer, so as to form the packaging substrate blocks.

4. The method of claim 1, wherein the complete panel of up-down paired packaging substrates is fabricated by the following steps of:

providing a first carrier board having two opposite surfaces;

forming an adhesive layer on each of the surfaces of the first carrier board;

installing on the adhesive layer a separable layer having an area less than the area of the first carrier board and surrounded by the adhesive layer;

forming a metal layer on the separable layer and the adhesive layer;

forming on the metal layer a plurality of conductive pads and a built-up structure sequentially, the built-up structure comprising at least a dielectric layer, a wiring layer formed on the dielectric layer, and a plurality of conductive vias formed in the dielectric layer and electrically connecting the wiring layer and the conductive pads, the wiring layer of an outermost layer of the built-up structure having the wire-bonding pads; and forming on the outermost layer of the built-up structure the insulating protection layer in which the openings are formed, allowing the wire-bonding pads to be exposed from the openings correspondingly.

5. The method of claim 4, wherein the packaging substrate blocks are fabricated by the following steps of:

cutting the complete panel of up-down paired packaging substrates along an edge thereof, with a cutting edge passing the separable layer;

removing the first carrier board and the separable layer, so as to separate the complete panel of up-down paired packaging substrates into two independent complete panels of packaging substrates; and cutting the complete panel of packaging substrates and removing the metal layer, so as to form the packaging substrate blocks.

6. The method of claim 1, further comprising forming a surface treatment layer on the wire-bonding pads.

7. The method of claim 6, wherein the surface treatment layer comprises Ni/Au, electroless nickel/electroless palladium/immersion gold (ENEPIG), Sn, Ag, or Au.

8. The method of claim 1, further comprising, after the second carrier board is removed, forming solder balls on the conductive pads.

9. A method of fabricating a packaging structure, comprising:

providing a complete panel of up-down paired packaging substrates, wherein a plurality of conductive pads and an insulating protection layer are formed on each of two outermost opposite surfaces of the packaging substrate, and a plurality of openings are formed on in each of the insulating protection layers, allowing the conductive pads to be exposed from the openings;

separating the complete panel of up-down paired packaging substrates and cutting the complete panel of packaging substrates, to form a plurality of packaging substrate blocks each including a first surface having a plurality of wire-bonding pads and the insulating protection layer and an opposite second surface having a dielectric layer and the wire-bonding pads embedded in and exposed from the dielectric layer, each of the packaging substrate blocks having M×N packaging substrate units arranged in an array, wherein M and N are integers greater than one;

installing a second carrier board on the insulating protection layer of the packaging substrate block;

mounting a semiconductor chip on the dielectric layer of each of the packaging substrate units, to form a packaging structure block having a plurality of packaging structure units, the semiconductor chip having an active surface and an opposite inactive surface, wherein the active surface has a plurality of electrode pads thereon, the inactive surface is stuck on the dielectric layer, and each of the electrode pads is electrically connected via a bonding wire to each of the wire-bonding pads correspondingly;

forming a molding material on the dielectric layer, the bonding wires and the semiconductor chips;

removing the second carrier board; and cutting the packaging structure blocks into the packaging structure units.

10. The method of claim 9, wherein the complete panel of up-down paired packaging substrates is fabricated by the following steps of:

providing a first carrier board having two opposite surfaces;

forming a separable layer on each of the surfaces of the first carrier board, the separable layer being less than the first carrier board in area;

forming an adhesive layer on a portion of each of the surfaces of the first carrier board where no separable layer is formed, allowing the adhesive layer to surround the separable layer;

forming a metal layer on the separable layer and the adhesive layer;

forming on the metal layer a plurality of wire-bonding pads and a built-up structure sequentially, the built-up structure comprising at least a dielectric layer, a wiring layer formed on the dielectric layer, and a plurality of conductive vias formed in the dielectric layer and electrically connecting the wiring layer and the wire-bonding pads, the wiring layer of an outermost layer of the built-up structure having the conductive pads; and forming on the outermost layer of the built-up structure the insulating protection layer in which the openings are formed, allowing the conductive pads to be exposed from the openings correspondingly.

11. The method of claim 10, wherein the packaging substrate blocks are fabricated by the following steps of:
- cutting the complete panel of up-down paired packaging substrates along an edge thereof, with a cutting edge passing the separable layer;
- removing the first carrier board and the separable layer, so as to separate the complete panel of up-down paired packaging substrates into two independent complete panels of packaging substrates; and
- cutting the complete panel of packaging substrates and removing the metal layer, so as to form the packaging substrate blocks.

12. The method of claim 9, wherein the complete panel of up-down paired packaging substrates is fabricated by the following steps of:
- providing a first carrier board having two opposite surfaces;
- forming an adhesive layer on each of the surfaces of the first carrier board;
- installing on the adhesive layer a separable layer having an area less than the area of the first carrier board and surrounded by the adhesive layer;
- forming a metal layer on the separable layer and the adhesive layer;
- forming on the metal layer a plurality of conductive pads and a built-up structure sequentially, the built-up structure comprising at least a dielectric layer, a wiring layer formed on the dielectric layer, and a plurality of conductive vias formed in the dielectric layer and electrically connecting the wiring layer and the conductive pads, the wiring layer of an outermost layer of the built-up structure having the wire-bonding pads; and
- forming on the outermost layer of the built-up structure the insulating protection layer in which the openings are formed, allowing the wire-bonding pads to be exposed from the openings correspondingly.

13. The method of claim 12, wherein the packaging substrate blocks are fabricated by the following steps of:
- cutting the complete panel of up-down paired packaging substrates along an edge thereof, with a cutting edge passing the separable layer;
- removing the first carrier board and the separable layer, so as to separate the complete panel of up-down paired packaging substrates into two independent complete panels of packaging substrates; and
- cutting the complete panel of packaging substrates and removing the metal layer, so as to form the packaging substrate blocks.

14. The method of claim 9, further comprising forming a surface treatment layer on the wire-bonding pads.

15. The method of claim 14, wherein the surface treatment layer comprises Ni/Au, electroless nickel/electroless palladium/immersion gold (ENEPIG), Sn, Ag, or Au.

16. The method of claim 9, further comprising, after the second carrier board is removed, forming solder balls on the conductive pads.

* * * * *